United States Patent
Kato et al.

(10) Patent No.: US 8,354,774 B2
(45) Date of Patent: Jan. 15, 2013

(54) DIELECTRIC MATERIAL FOR POLYMERIC ACTUATOR, AND POLYMERIC ACTUATOR USING THE SAME

(75) Inventors: Toshinori Kato, Tsukuba (JP); Tomiaki Otake, Tsukuba (JP); Taketoshi Okuno, Kurashiki (JP); Nozomu Sugoh, Kurashiki (JP); Toshihiro Hirai, Ueda (JP)

(73) Assignees: Kuraray Co., Ltd., Kurashiki-Shi (JP); Shinshu University, Matsumoto-Shi (JP)

( * ) Notice: Subject to any disclaimer, the term of this patent is extended or adjusted under 35 U.S.C. 154(b) by 499 days.

(21) Appl. No.: 12/673,729

(22) PCT Filed: Aug. 7, 2008

(86) PCT No.: PCT/JP2008/064215
§ 371 (c)(1),
(2), (4) Date: Feb. 16, 2010

(87) PCT Pub. No.: WO2009/025187
PCT Pub. Date: Feb. 26, 2009

(65) Prior Publication Data
US 2011/0018400 A1    Jan. 27, 2011

(30) Foreign Application Priority Data

Aug. 17, 2007    (JP) .................................. 2007-213070

(51) Int. Cl.
*H01L 41/08* (2006.01)
(52) U.S. Cl. .................. 310/328; 310/800; 524/545
(58) Field of Classification Search .................. 310/328, 310/800; 524/545
See application file for complete search history.

(56) References Cited

U.S. PATENT DOCUMENTS 5,977,685 A * 11/1999 Kurita et al. ................... 310/311
8,138,246 B2 * 3/2012 Kato et al. ..................... 524/106

FOREIGN PATENT DOCUMENTS

| JP | A 63-304679 | 12/1988 |
| JP | B2 2698716 | 11/1998 |
| JP | A 2002-105226 | 4/2002 |
| JP | A 2003-505865 | 2/2003 |
| JP | A 2003-506858 | 2/2003 |
| JP | A 2003-526213 | 9/2003 |
| JP | A 2005-001885 | 1/2005 |
| JP | A 2005-223025 | 8/2005 |

OTHER PUBLICATIONS

International Search Report issued in corresponding International Application No. PCT/JP2008/064215, issued Nov. 4, 2008 (with translation).

* cited by examiner

*Primary Examiner* — J. San Martin
(74) *Attorney, Agent, or Firm* — Oliff & Berridge, PLC

(57) ABSTRACT

A dielectric material for a polymeric actuator having a moveable part of the polymeric actuator driven by an electric field, the dielectric material containing a block copolymer (A) having a microphase-separated structure including a polymer block (B1) and a polymer block (B2), both of which are immiscible with each other. A main compositional unit in both of the polymer block (B1) and the polymer block (B2) is a (meth)acrylic ester unit, the polymer block (B1) having an alpha-dispersion temperature of 70° C. or more, and the polymer block (B2) having an alpha-dispersion temperature of 25° C. or less. The polymeric actuator provides the dielectric material between electrodes.

8 Claims, 1 Drawing Sheet

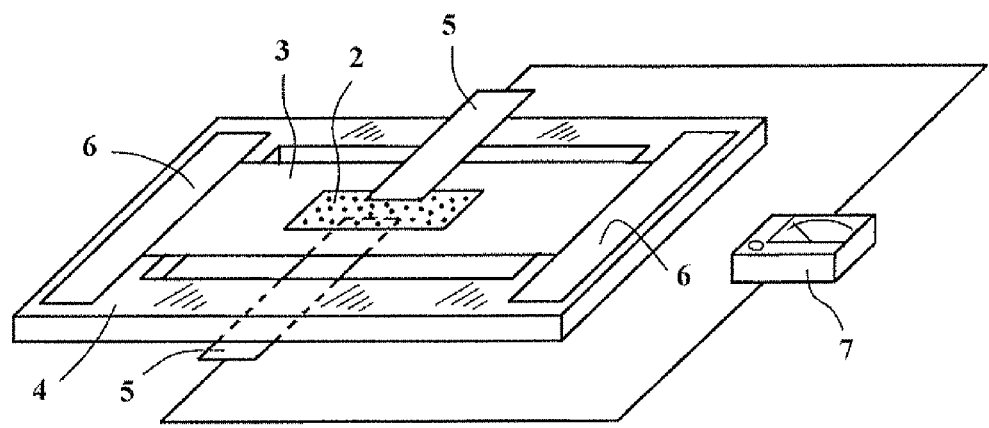

US 8,354,774 B2

DIELECTRIC MATERIAL FOR POLYMERIC ACTUATOR, AND POLYMERIC ACTUATOR USING THE SAME

TECHNICAL FIELD

The present invention relates to a dielectric material for a polymeric actuator which has an excellent operation performance and moldability, and also relates to a polymeric actuator using the dielectric material.

BACKGROUND OF THE INVENTION

Conventionally, actuators such as servomotors, linear motors, stepping motors, electromagnetic actuators, fluid pressure actuators, etc. have been used in various fields of for example industrial robots, precision machines and switching operation elements. Recently, there is an enhanced demand for miniaturized, lightweight and highly flexible actuators. As such actuators, polymeric actuators driven by an electric field are drawing attention. Demand for the polymeric actuators is especially growing in such fields of for example medical equipments, micro machines, industrial robots and personal robots.

As such polymeric actuators, actuators using polymeric dielectric materials which have an excellent output/mass ratio or output/volume ratio are disclosed for example in Patent Documents of Japanese Unexamined Patent Application Nos. 2003-506858, 2003-526213 and 2005-1885 as well as Japanese Patent No. 2698716. In these polymeric actuators, materials such as an acrylic elastomer, a silicone elastomer, a polyurethane elastomer, a polyvinyl alcohol-based gel and a polyvinyl chloride-based gel are used for the dielectric materials. When voltage of more than several hundreds to one thousand volts is applied, the materials are highly expanded in the film surface direction thereof. Though various theories have been proposed about this phenomenon of the polymeric actuators, Maxwell stress arisen from the electrostatic force generated by the applied electric field is thought to be a main driving source.

Maxwell stress is a force proportional to a dielectric constant or more accurately to the product of relative permittivity and the permittivity of vacuum, or to the square of the applied voltage. Therefore, in order to make the polymeric actuator demonstrate more powerful output force even when the same voltage is applied, the dielectric material is desired to have a higher dielectric constant. Furthermore, the amount of displacement (or stroke), which is one of the important indicators in evaluating the performance of polymeric actuators, becomes large as the Young's modulus becomes small, when there is no difference in the levels of the generated Maxwell stress. Accordingly, it is desirable that the dielectric material has a low Young's modulus. Dielectric materials disclosed in the above-mentioned Patent Documents meet these requirements. However, in the case of using the acrylic elastomer or the silicone elastomer, crosslinking is required for use as a dielectric material. Therefore, there are some difficulties in molding them into a desired shape. In addition, chemical crosslinking is necessary to keep these dielectric materials into a desired shape of, for example, a membrane-shape. Therefore, the molding process is somewhat cumbersome. The chemical crosslinking in such elastomers is not always homogeneous, so that stress concentration at molecular chain level occurs within the elastomers when deformed, causing poor mechanical strength. The polyurethane elastomer in general has high Young's modulus and poor weather resistance, being undesirable. In the polyvinyl alcohol-based gel and the polyvinyl chloride-based gel, a large amount of plasticizer having a high dielectric constant can be used, so that dielectric materials having a high dielectric constant and low Young's modulus can easily be prepared, but there are some problems such as changes in properties including deterioration of dielectric materials due to bleeding out of the plasticizer itself or migration of the plasticizer to neighboring members.

On the other hand, in Japanese Unexamined Patent Application No. 2003-526213 and Japanese Patent No. 2698716, thermoplastic elastomers such as styrene-butadiene block copolymer, etc. are disclosed as a dielectric material. However, the styrene-butadiene block copolymer has a poor relative permittivity of 2.2, so it is hard to say that the polymeric actuators made from this dielectric material has excellent performance.

SUMMARY OF THE INVENTION

The present invention has been developed to solve such problems mentioned above and an object of the present invention is to provide a dielectric material for polymeric actuators, which has a high dielectric constant, low Young's modulus, excellent operation performance, easy moldability and high production efficiency. Another object of the present invention is to provide a polymeric actuator comprising the dielectric material and having high operation performance.

The dielectric material for a polymeric actuator of the present invention developed for accomplishing foregoing objects comprised of a moveable part of the polymeric actuator driven by an electric field comprises;

a block copolymer (A) having a microphase-separated structure including a polymer block (B1) and a polymer block (B2) both of which are immiscible with each other, wherein a main compositional unit in the polymer block (B1) and the polymer block (B2) is a (meth)acrylic ester unit, the polymer block (B1) has an alpha-dispersion temperature of 70° C. or more, and the polymer block (B2) has an alpha-dispersion temperature of 25° C. or less.

In the dielectric material for the polymeric actuator, the block copolymer (A) has a block sequence of polymer block (B1)-polymer block (B2)-polymer block (B1).

In the dielectric material for the polymeric actuator, the main compositional unit in the polymer block (B1) is a methyl methacrylate unit and the main compositional unit in the polymer block (B2) is an alkyl acrylate unit whose alkyl group has 1 to 5 carbon atoms.

In the dielectric material for the polymeric actuator, the dielectric material comprises the block copolymer (A) having the polymer block (B1) and the polymer block (B2) and another block copolymer (A) having a polymer block (B1) and a polymer block (B2) whose block sequence differs from that of the block copolymer (A).

The dielectric material for the polymeric actuator further comprises a plasticizer in an amount less than 100 parts by mass based on 100 parts by mass of the block copolymer (A).

A polymeric actuator has the dielectric material for the polymeric actuator between electrodes.

In the polymeric actuator comprising the dielectric material, a main electroconductive material used in the electrodes is carbon nanofiber.

In the polymeric actuator comprising the dielectric material, the electrodes contain the block copolymer (A) and carbon nanofiber.

The dielectric material of the present invention comprises;
a block copolymer (A) having:
a flexible portion comprising an alkyl acrylate polymer block (B2) having a high dielectric constant, as a flexible rubbery component and
a rigid portion comprising a methyl methacrylate polymer block (B1) having a high dielectric constant, as a physical crosslinking component.

Accordingly, the dielectric material has flexibility as well as a high dielectric constant. The dielectric constant is considerably higher than that of the disclosed conventional polymers for a dielectric material for a polymeric actuator. Further, Young's modulus of the dielectric material can be controlled arbitrarily and widely by changing the ratio of the polymer block (B1) to the polymer block (B2), so that Young's modulus of the dielectric material can be kept low. Therefore, the dielectric material of the present invention has excellent operation performance.

In addition, because the block copolymer (A) has a nature peculiar to a thermoplastic elastomer, it is flexible and there is no need of introducing chemical crosslinking by any crosslinking agents. Therefore, the dielectric material of the present invention can be easily molded into any desired shape using various molding processes. Further, because there is no fear of deterioration of the dielectric material caused by bleeding, sublimation or migration of the plasticizer to neighboring members, the dielectric material of the present invention shows excellent reliability and stability for long term service.

The polymeric actuator of the present invention is capable of improving shape flexibility because it is made of the above-mentioned dielectric material. Accordingly, when the polymeric actuator is driven by an electric field through applied electrodes, the polymeric actuator is highly expanded and deformed immediately, showing excellent operation performance.

BRIEF DESCRIPTION OF THE DRAWING

FIG. 1 is a perspective view showing a polymeric actuator and an embodiment of the driving system of the present invention.

DETAILED EXPLANATION OF THE INVENTION

A block copolymer (A) which is used for the dielectric material of the present invention comprises a polymer block (B1) that is a physical crosslinking component and a polymer block (B2) that is a flexible rubbery component. The polymer block (B1) and the polymer block (B2) are to meet the following requirements (1) to (3).

Requirement (1): the polymer block (B1) and the polymer block (B2) are immiscible with each other so that a microphase-separated structure is formed accordingly.

Requirement (2): alpha-dispersion temperature (T$\alpha$) of the polymer block (B1) is 70° C. or more and that of the polymer block (B2) is 25° C. or less.

Requirement (3): The polymer block (B1) and the polymer block (B2) both have a (meth)acrylic acid ester unit as a main compositional unit.

As examples of the main compositional unit in the polymer block (B1) which meet the requirements of (1) to (3) above, a methacrylic acid ester such as methyl methacrylate, isobutyl methacrylate, t-butyl methacrylate, cyclobutyl methacrylate, cyclopentyl methacrylate, cyclohexyl methacrylate, 3,3,5-trimethylcyclohexyl methacrylate, isobornyl methacrylate, adamantyl methacrylate, phenyl methacrylate, etc.; and an acrylic acid ester such as, isobornyl acrylate, adamantyl acrylate, etc. can be exemplified. Among them, when methyl methacrylate, isobornyl methacrylate, adamantyl methacrylate, isobornyl acrylate or adamantyl acrylate is used, thermal stability of the block copolymer (A) is improved, being desirable. Methyl methacrylate is particularly preferable because it is easily available and the block copolymer (A) can be easily produced.

With respect to T$\alpha$ of the polymer block (B1), if T$\alpha$ is too low, stress relaxation characteristics of the block polymer (A) or the dielectric material for the polymeric actuator becomes degraded at around a room temperature, being undesirable. In view of this, T$\alpha$ is preferably 70° C. or more, more preferably 85° C. or more, still more preferably 100° C. or more.

There is no specific limitation on the number-average molecular weight of the polymer block (B1), but preferably it should be in a range of 1,000 to 500,000, more preferably 3,000 to 300,000, still more preferably 5,000 to 100,000.

In a case where the molecular weight of the polymer block B1 is too low, stress relaxation characteristics and mechanical strength of the polymer becomes degraded, being undesirable. On the contrary, in a case where the molecular weight is too high, moldability of the block copolymer (A) or the dielectric material for the polymeric actuator becomes poor, being undesirable, too.

As examples of the main compositional unit of the polymer block (B2) which meets the requirements of (1) to (3) above, a methacrylic acid ester such as n-butyl methacrylate, pentyl methacrylate, hexyl methacrylate, 2-ethylhexyl methacrylate, octyl methacrylate, decyl methacrylate, dodecyl methacrylate, dimethylaminoethyl methacrylate, diethylaminoethyl methacrylate, etc.; and an acrylic acid ester such as methyl acrylate, ethyl acrylate, propyl acrylate, n-butyl acrylate, hexyl acrylate, heptyl acrylate, octyl acrylate, 2-ethylhexyl acrylate, nonyl acrylate, methoxymethyl acrylate, 2-ethoxyethyl acrylate, 3-ethoxypropyl acrylate, 4-cyanobutyl acrylate, etc. can be exemplified. Among them, the acrylic acid esters, in particular n-butyl acrylate and 2-ethylhexyl acrylate are preferable because they give high flexibility. Further, the acrylic acid alkyl esters whose alkyl group has 5 or less carbon atoms are preferable, and n-butyl acrylate is more preferable because they give an excellent dielectric constant.

There is no specific limitation on the number-average molecular weight of the polymer block (B2), but preferably it should be in a range of 1,000 to 500,000, more preferably 3,000 to 300,000, still more preferably 5,000 to 200,000.

The block copolymer (A) may be a mixture of 2 or more kinds of block copolymers each of which has the polymer block (B1) and the polymer block (B2), wherein composition of a monomer unit or number-average molecular weight of respective polymer blocks may be different from each other.

The polymer block (B1) and the polymer block (B2) are immiscible with each other and consequently form the microphase-separated structure. That is, the block copolymer (A) has naturally the microphase-separated structure. When two mutually immiscible polymer blocks are forcibly block polymerized to give the polymer, no macro-scale phase separation occurs, but instead a phase-separated structure having various formations of micro-scale (several dozen nanometer-scale) morphology is formed in the polymer. The structure formed in this manner is referred to as the microphase-separated structure. Whether the block copolymer forms the microphase-separated structure or not can be confirmed by observing it using, for example, a transmission electron microscope (TEM) or an atom force microscope (AFM), or by measuring dynamic viscoelasticity.

Confirmation of the microphase-separated structure formed from the polymer block (B1) and the polymer block (B2) by measuring the dynamic viscoelasticity can be carried out by observing whether an alpha-dispersion peak derived from the polymer block (B1) and another alpha-dispersion peak derived from the polymer block (B2) are detected or not in the loss tangent (tan δ) data measured.

When the polymer block (B1) and the polymer block (B2) form the microphase-separated structure, two alpha-dispersion peaks can be observed in loss tangent under temperature dispersion. On the other hand, if the polymer block (B1) and the polymer block (B2) are miscible with each other and accordingly the microphase-separated structure is not formed, only one single alpha-dispersion peak is observed.

In addition, by referring to each solubility parameter (SP) of the polymer block (B1) and the polymer block (B2), the formation of the microphase-separated structure can be predicted. Generally, polymers which are similar to each other in terms of solubility parameter tend to be miscible, and polymers having the solubility parameters largely different from each other tend to be immiscible. Presence or absence of the microphase-separated structure may be determined by using only one method alone or a combination of two or more methods.

There is no particular limitation on the combination of the polymer block (B1) (hereinafter abbreviated as B1) and another polymer block (B2) (hereinafter abbreviated as B2). For example, combinations of (B1) made from methyl methacrylate and (B2) made from n-butyl acrylate, (B1) made from methyl methacrylate and (B2) made from 2-ethylhexyl acrylate, (B1) made from methyl methacrylate and (B2) made from dodecyl methacrylate, etc. can be exemplified. Given the dielectric constant and flexibility, the combination of (B1) made from methyl methacrylate and (B2) made from n-butyl acrylate, or (B1) made from methyl methacrylate and (B2) made from 2-ethylhexyl acrylate is preferable. The combination of (B1) made from methyl methacrylate and (B2) made from n-butyl acrylate is the most preferable.

There is no particular limitation on the block sequence of (B1) and (B2) which are contained in the block copolymer (A). For example, a tri-block sequence represented by (B1)-(B2)-(B1) or (B2)-(B1)-(B2), a tetra-block sequence represented by (B1)-(B2)-(B1)-(B2), or a penta-block sequence represented by (B1)-(B2)-(B1)-(B2)-(B1) or (B2)-(B1)-(B2)-(B1)-(B2), etc. can be exemplified. Given the elasticity of the dielectric material and the performance of the polymeric actuator made from the dielectric material, the tri-block polymer represented by (B1)-(B2)-(B1) and the penta-block polymer represented by (B1)-(B2)-(B1)-(B2)-(B1) are preferable, in particular, the tri-block polymer represented by (B1)-(B2)-(B1) is more preferable in viewpoint of simple production thereof.

There is no particular limitation on a composition ratio of the polymer block (B1) to the polymer block (B2). If the ratio of (B1) is too high, the flexibility of the block copolymer (A) or the dielectric material for the polymeric actuator is degraded, being undesirable. If the ratio of (B2) is too high, the mechanical strength of the block copolymer (A) or the dielectric material for the polymeric actuator is degraded, being undesirable. From these points of view, the ratio by weight of (B1) to (B2) is preferably in a range of 10:90 to 90:10, more preferably in the range of 20:80 to 80:20. In a case where a plurality of different (B1) and (B2) are contained in the block polymer (A), the ratio by weight should be calculated based on all (B1) and (B2) in the block polymer respectively.

Further, the dielectric material of the present invention contains the polymer block (B1) and the polymer block (B2), and may contain other kind or kinds of block copolymer (A) having a different block sequence. When the dielectric material contains a mixture of two or more kinds of block copolymers (A), each polymer block (B1) and polymer block (B2) in each block copolymer (A) may have a different compositional unit and number-average molecular weight, and ratio by mass of each block copolymer (A) is not limited. For example, in a case where a tri-block polymer represented by (B1)-(B2)-(B1) is used as a first block copolymer ($A_1$) and a di-block polymer represented by (B1)-(B2) is contained as a second block copolymer ($A_2$), the flexibility of the dielectric material is improved, so that large deformation can be achieved with small force when the dielectric material is configured into a polymeric actuator. In such cases, ratio by mass of tri-block polymer to di-block polymer is in a range of, for example, 8:2 to 2:8, in view of flexibility, moldability, etc. thereof.

Examples of a method for producing the block copolymer (A) from the polymer block (B1) and the polymer block (B2) are:

a living polymerization method such as a living anionic polymerization method or a living radical polymerization method;

a method of initiating polymerization from the terminal of molecule of the polymer block (B1) or the polymer block (B2), after synthesis of the polymer block (B1) or the polymer block (B2) as a precursor; or a method for reacting the polymer block (B1) with the polymer block (B2), each of which has a functional group at the terminal thereof. These methods are not limited particularly, and can be selected arbitrarily in accordance with the intended structure of the block copolymer (A).

The number-average molecular weight of the block copolymer (A) as a whole is preferably in the range of 2,000 to 2,000,000, more preferably 10,000 to 500,000, still more preferably 30,000 to 300,000. When the molecular weight is in this range, mechanical strength is excellent and molding can be carried out easily.

The polymer block (B1) and/or the polymer block (B2) may contain a monomer component having a polar group as a secondary component to improve the dielectric constant. As examples of the monomer component having the polar group, cyanomethyl (meth)acrylate, 2-cyanobutyl (meth)acrylate, 4-cyanobutyl (meth)acrylate, pentabromobenzyl (meth)acrylate, pentachlorobenzyl (meth)acrylate, methoxymethyl (meth)acrylate, 2-methoxyethyl (meth)acrylate, 2-ethoxyethyl (meth)acrylate, 3-ethoxylpropyl (meth)acrylate, polyethyleneglycol monoalkyl ether (meth)acrylate, 2-hydroxyethyl (meth)acrylate, 2-aminoethyl (meth)acrylate, 2-dimethylaminoethyl (meth)acrylate, 2-diethylaminoethyl (meth)acrylate etc. can be exemplified. The content of such secondary components is 30 or less percent by mass based on the total mass, more preferably not more than 10 percent by mass. If the secondary component is contained more than the level mentioned above, ease of productivity of the block copolymer (A) is lowered.

The block copolymer (A) may contain a different monomer component in an amount that does not impair the effects of the present invention in addition to the polymer block (B1) and the polymer block (B2). As examples of such monomers, styrene derivatives such as styrene, 4-methyl styrene, α-methyl styrene, 1,1-diphenyl ethylene, etc.; unsaturated nitriles such as acrylonitrile, methacrylonitrile, etc.; (meth)acrylamids such as acrylamide, (meth)acrylamide, N-substituted derivatives thereof, etc.; vinyl ethers such as methyl vinyl ether, ethyl vinyl ether, iso-butyl vinyl ether, etc.; α-olefines such as ethylene, propylene, 1-butene, 1-hexene, 1-octene, etc.; and isobutylene etc. can be exemplified. These monomers can be used either alone or in combination of two or more. The content of such monomers may be 30 percent or less by mass, more preferably 10 percent or less by mass based on the whole mass. If such monomers are contained more than the amount mentioned above, ease of productivity of the block copolymer (A) is lowered.

The block copolymer (A) may have a different polymer block (b) in addition to the polymer block (B1) and the polymer block (B2). If there is no adverse impact on the effects of the present invention, no limitation is imposed on the number of the different polymer block (b), that is, any number of different polymer blocks such as a polymer block (b1), a polymer block (b2), a polymer block (b3), etc. each of which has different compositional unit from each other, can be introduced. As examples of the polymer block (b), a polymer block having compositional units which were already demonstrated above in the polymer block (B1) and the polymer block (B2), a polystyrene derivative block such as polystyrene, poly(4-methylstyrene), poly(α-methylstyrene), etc.; a polyconjugated diene block such as polybutadiene, polyisoprene, poly (1,3-cyclohexadiene) and hydrogenated products thereof; a polyvinylalcohol block; a polyhalogenated vinyl block such as polyvinyl chloride, polyvinylidene chloride, polyvinylidene fluoride, polytetrafluoroethylene, etc.; a polyester block such as polyethylene terephthalate, polybutylene terephthalate, polyethylene naphtholate, etc.; a polyamide block such as polyamide 6, polyamide 6,6, polyamide 6T, polyamide 9T, polyamide 6,12, etc.; and a polyether block such as polyoxymethylene, polyethyleneglycol (polyoxyethylene), polypropylene glycol (polyoxypropylene), etc. are exemplified. As for the number-average molecular weight of the polymer clock (b), there is no specific limitation, but the number-average molecular weight is preferably in a range of 1,000 to 500,000, more preferably 3,000 to 300,000, still more preferably 5,000 to 100,000.

In order to preferably control the dielectric constant and Young's modulus, the dielectric material of the present invention contains the polymer block (B1) and the polymer block (B2) which meet the requirements (1) to (3) mentioned above, and may contain a plurality of block copolymers (A) which are different from each other in terms of block sequence. For instance, when one of the block copolymer (A) is a tri-block polymer of (B1)-(B2)-(B1), another block copolymer (A) comprising a di-block copolymer having a block sequence of (B1)-(B2), another block copolymer (A) comprising a tetra-block copolymer having a sequence of (B1)-(B2)-(B1)-(B2), etc. can be exemplified as the block copolymers which may be further contained in the dielectric material. Of these block copolymers, the di-block copolymer of (B1)-(B2) is preferably used in view of the flexibility of the dielectric material.

The dielectric material of the present invention may contain additives in an amount that does not impair the effects of the present invention. As the additives, plasticizers, inorganic fillers, thermal stabilizers, antioxidants, light stabilizers, UV absorbers, adhesives, tackifiers, and antistatic agents can be exemplified. As the plasticizers, mineral oils such as a paraffinic oil, a naphthenic oil, etc.; ester-based plasticizers such as di(2-ethylhexyl) phthalate, dihexyl phthalate, dinonyl phthalate, di(2-ethylhexyl) adipate, dioctyl adipate, dinonyl adipate, etc.; oligomers such as an acrylic acid derivative oligomer, etc. are exemplified. The above-mentioned inorganic fillers are added to improve dielectric constant, heat resistance, weather resistance, mechanical strength, etc. Such as titanic oxide, silica, clay, barium sulfate, calcium carbonate, talc, glass fiber, glass beads, lead zirconate titanate, etc. are exemplified as inorganic fillers. Further, the dielectric material of the present invention may contain synthetic rubbers such as acrylic rubber, polybutene rubber, polyisobutylene rubber, ethylene-propylene rubber, ethylene-propylene-diene rubber, acrylonitrile-butadiene rubber, butadiene rubber, etc. These additives may be added either alone or in combination of two or more. There is no specific limitation on the amount of additives, and the amount additives should preferably be 100 parts or less by mass based on 100 parts by mass of the block copolymer (A), more preferably 70 parts or less by mass based on 100 parts by mass of the block copolymer (A). When the additives are added within the range mentioned above, functionality and stability of the resulting dielectric material or the polymeric actuator are improved.

The dielectric material of the present invention can be formed into various shapes in accordance with an intended use of the polymeric actuators. The dielectric material is preferably formed into a membrane, but it may be formed into a shape of film, sheet, plate, fiber, rod, cube, cuboid, sphere, rugby ball-like or a more complicated shape. Various forming methods of the dielectric material can be adopted in accordance with the intended uses. As the forming method, extrusion molding, blow molding, calender molding, rotational molding, compression molding, injection molding, roll molding or vacuum molding, all of which can be carried out under a molten state of the block copolymer (A); and a printing or coating method such as spin coating, screen printing or spray coating etc., can be exemplified. Further, the block copolymer (A) has heat plasticity, so that a heat forming process can also be adopted.

When the dielectric material of the present invention is inserted between at least two electrodes to form a polymeric actuator, the dielectric material should have a sufficient thickness to avoid a short circuit. On the other hand, Maxwell stress increases and performance of the polymeric actuator is improved as a distance between the electrodes of the polymeric actuators become short. In view of these points, the thickness of the dielectric material is preferably in the range of 0.1 μm to 1 cm, more preferably 1 μm to 1 mm, still more preferably 5 μm to 500 μm, A pre-strain may be given to the dielectric material to improve the performance of the polymeric actuator.

The provided polymeric actuator of the present invention has the dielectric material inserted between at least two electrodes. The electrodes for the polymeric actuator are used to apply voltage to the dielectric material. It is required that the electrodes deform without impairing the operation of the actuator and after the deformation the electrodes are not physically and electrically damaged. The polymeric actuator of the present invention essentially has a condenser structure having a comparatively small capacitance of several picofarads per $cm^2$ of the polymeric actuator. As described in above-mentioned Japanese Unexamined Patent Application No. 2003-506858, conductive property (or resistance) of the electrode can be selected based on an RC time constant so that when the resistance of the electrode is $10^6$ to $10^{11}$ Ohm, it is possible to make the polymeric actuator operate at a speed suitable for practical use. As material for such electrodes, carbon materials such as carbon nanofiber, carbon black, etc.; metal colloids such as colloidal silver, etc.; charge-transfer complexes such as tetra thiafluvalene/tetra cyano-quinodimethane, etc.; and electroconductive polymers such as polypyrrole, etc. can be exemplified. Among them, the carbon material, particularly, the carbon nanofiber is preferably used because it is easy to handle, low in cost and excellent in electroconductivity. The above mentioned materials can be used, either alone or in combination of two or more, in the electrode.

The carbon nanofiber used for the electrode is highly-crystalline fine carbon fiber having a diameter of nano-order level of about 1 to 1,000 nm and a length of about 10 μm at maximum. More precisely, vapor-grown carbon fiber VGCF (available from Showa Denko Kabushiki Kaisha; registered trade mark) can be exemplified.

As methods for forming of the electrode, spraying the electrode material such as carbon nanofiber or carbon material on the dielectric material; laminating a binder polymer, into which the electrode material is previously dispersed, on the dielectric material; coating or printing an ink, which is prepared by dispersing the electrode material in an appropriate vehicle, on the dielectric material in an appropriate manner; coating or printing an ink, which is prepared by dispersing or dissolving both of the electrode material and binder polymer with an appropriate vehicle, on the dielectric material in an appropriate manner; etc. can be exemplified. The method for forming the electrode can be arbitrarily selected and adopted in accordance with an intended use and a shape of the polymeric actuator.

In order to reduce the resistance of the electrode in the surface direction, an electroconductive layer or wire which is made thin and fine by patterning an electroconductive material, may be provided on the electrode. As the electroconductive material, carbon materials such as a single wall carbon nanotube, double wall carbon nanotube, multi wall carbon nanotube, carbon nanofiber, vapor-grown carbon fiber (VGCF), electroconductive carbon, etc.; and metals such as gold, etc., are exemplified. Among them, the metals are preferable in view of resistance. The electroconductive layer or line is formed on the electrode by, for example, a vacuum deposition or ion sputtering techniques.

The polymeric actuator of the present invention can be operable in various environments such as in air, or vacuum atmosphere, etc. In accordance with an intended use, the polymeric actuator may be sealed by resins, etc. which have insulation property.

Manufacturing examples of the polymer actuators of the present invention is shown in the following Examples, and manufacturing examples of the polymer actuators outside the present invention are shown in the following Comparative Examples. Chemical agents such as solvent and monomer, which are not specifically commented in this specification, were purified, if necessary, in accordance with routine procedures, and then used.

Block copolymers and the manufactured polymeric actuators were characterized as follows.
(1) Determination of number-average molecular weight (Mn) and molecular weight distribution (Mw/Mn) which were carried out using gel permeation chromatography (GPC).
Instrument: Gel Permeation Chromatograph HLC-8020 which is available from Tosoh Corporation
Column: GMHXL, G4000HXL and G5000HXL which were connected in series and each containing TSKgel which is available from Tosoh Corporation
Eluent: tetrahydrofuran, flow rate 1.0 mL/min.
Calibration curve: Calibration curve which was made using standard polystyrene
Detection method: Detection by Refractive index (RI)
(2) Analysis of molecular structure of block copolymer using nuclear magnetic resonance spectrum ($^1$H-NMR)
Instrument: Nuclear Magnetic Resonance (JNM-LA 400) available from JEOL Ltd.
Solvent: Deuterated chloroform
(3) Dynamic viscoelasticity measurement A block copolymer was heat-pressed at 220° C. to obtain 1 mm thick sheet, from which a rectangular-shaped sheet having 20 mm long by 5 mm wide was cut out and used as a test piece. Measurement was carried out using a broad frequency range dynamic viscoelasticity measuring equipment "Rheospectler DVE-V4FT" available from Rheology Co. under a tensile mode (frequency 11 Hz) and at a temperature increasing rate of 3° C./min. When the test piece had fluidity, the above-mentioned measurement could not be carried out, a round-shaped test piece having a diameter of 25 mm was curved out and measurement thereof was carried out using ARES available from Rheometric Scientific Inc. under a twist mode (frequency 11 Hz) and at a temperature increasing rate of 3° C./min. The peak temperature of loss tangent (tan δ) was symbolized as Tα. When the block copolymer has a microphase separation, multiple Tαs were observed in proportion to the number of components and accordingly Tα was used as an indicator showing the presence or absence of the microphase separation.
(4) Determination of relative permittivity A test piece measuring 25 mm in diameter and 1 mm thick was subjected to the determination using a relative permittivity measuring equipment LCR meter 4284A available from Agilent Technologies Inc. and Dielectric Test Fixture 16451B available from Agilent Technologies Inc. as an electrode at a frequency of 1 kHz under a non-contacting electrode method (air gap method).
(5) Operation test of polymer actuators When direct voltage of 3 kV was applied to aluminum foils placed on both electrodes of the polymeric actuator, the actuator operated quickly. A linear stain and an area strain before and after the operation were calculated.
(6) Durability test of dielectric material for polymeric actuators As represented in FIG. 1, on the plastic plate 4 having an opening cut out at a central portion thereof, a film of the block copolymer or various kinds of material having 1.8 cm long by 3 cm wide was stretched to double its original width and then it was placed on the plastic plate 4 having the opening and fixed using seals 6 made of Teflon (Registered trade mark). It was kept as it was for 5 hours at a room temperature, then a state of the film was visually inspected and evaluated as follows.

++: no change +: a little loosened –: largely loosened ––: fractured

Synthetic Example 1

Production of Polymethyl methacrylate-b-poly n-butylacrylate-b-polymethyl methacrylate At first, toluene, which is guaranteed-grade toluene and available from Kishida Chemical Co., Ltd, methyl methacrylate available from Kuraray Co. Ltd., n-butyl acrylate, which is guaranteed-grade n-butyl acrylate and available from Kishida Chemical Co., Ltd. were pre-treated as follows; toluene, methyl methacrylate and n-butyl acrylate were each brought into contact with Zeolum to remove a polymerization inhibitor, and then nitrogen gas was fully bubbled to purge dissolved oxygen.

To a one-litter three-necked flask, a three-way stopcock was attached and the inner portion was degassed and replaced with dry nitrogen gas. 400 g of the pretreated toluene, 0.94 ml of N,N,N',N'',N''-pentamethyl diethylene triamine available from Aldrich, it was used after vacuum distillation) and 18 mL of toluene solution containing 11 mmol of isobutyl-bis-(2,6-di-t-butyl-4-methyl phenoxy) aluminum available from Nippon Aluminum Alkyls, Ltd. are added at a room temperature. Further, 0.8 mL of cyclohexane solution containing 1 mmol of sec-butyl lithium available from Asia Lithium Corp. was added. Then 7.8 mL (73.6 mmol) of pretreated methyl methacrylate was further added into the three-necked flask. At this moment the reaction solution turned yellow. After stirring for 1 hour at 25° C., the reaction solution turned colorless. A small amount of reaction solution was sampled from the reaction solution. Number-average molecular weight was 9,600 g/mol.

After the three-necked flask with the reaction solution was cooled by being immersed into a cooling bath whose temperature was controlled at −30° C., 55.2 mL (385 mmol) of pretreated n-butyl acrylate was added drop by drop for the duration of 4 hours and reacted. At the moment n-butyl acrylate was added, the reaction solution instantly turned yellow and then returned to colorless immediately. After the addition was over, a small amount of the reaction solution was sampled. Number-average molecular weight was 69,800 g/mol.

7.8 mL (7.8 mmol) of pretreated methyl methacrylate was added to the reaction solution and reacted with stirring at a room temperature. The reaction solution was at first colored yellow, but after stirring for 10 hours at a room temperature it turned colorless. At this point, 1 mL of degassed methanol was added to the reaction solution to terminate the polymerization. After the termination of the reaction, number average molecular weight was 79,200 g/mol.

After adding water to the reaction solution and then extracting thereof, the reaction solution was poured into a large amount of methanol, obtaining a white precipitate. The resulting precipitate was filtered and separated and then dried overnight at 50° C. to obtain a tri-block copolymer. A portion of the resulting elastomeric tri-block copolymer was dissolved in deuterated chloroform and then subjected to measurement of nuclear magnetic resonance spectrum ($^1$H-NMR) (nuclear magnetic resonance measuring equipment JNM-ECX400 available from JEOL Ltd.; deuterated chloroform was used as solvent), to identify that the polymer was a tri-block copolymer of polymethyl methacrylate-b-poly n-butyl acrylate-b-polymethyl methacrylate having 23% by mass of polymethyl methacrylate.

In Synthetic Example 1 mentioned above, various block copolymers were synthesized by changing reagents and the amount thereof. Properties of the resulting block copolymers and polystyrene-b-polybutadiene-b-polystyrene tri-block copolymer SBS D1102 available from Kraton Polymers, which was obtained, are shown in Table 1.

TABLE 1

Materials and their physical properties

| | Polymer | | | |
|---|---|---|---|---|
| | A-1 | A-2 | C-1 | C-2 |
| (B1) Bock Component | PMMA | PMMA | PEMA | PS |
| (B2) Bock Component | PnBA | PnBA | PnBA | PB |
| Block Sequence | B1-B2-B1 | B1-B2 | B1-B2-B1 | B1-B2-B1 |
| Physical Properties | | | | |
| Mn of (B1) | 9600 | 4500 | 10200 | N.D. |
| Mn of (B2) | 60200 | 51000 | 63400 | N.D. |

TABLE 1-continued

Materials and their physical properties

| | Polymer | | | |
|---|---|---|---|---|
| | A-1 | A-2 | C-1 | C-2 |
| Tα (° C.) | 130, −27 | 126, −30 | 67, −25 | 103, −79 |
| Microphase Separation | Presence | Presence | Presence | Presence |
| Dielectric Constant | 4.4 | 4.7 | 4.2 | 2.2 |

PMMA: Polymethylmethacrylate,
PnBA: Poly n-butylacrylate,
PEMA: Polyethylmethacrylate,
PS: Polystyrene,
PB: Polybutadiene
N.D.: No Data Synthetic Example 2

Preparation of Cross-Linked Poly n-butyl Acrylate Film (C-3)

10 g of n-butyl acrylate, 0.18 g of, 6-hexane diol diacrylate, 65 mg of di-t-butyl peroxide and 65 mg of azobisisobutyronitrile were mixed to form a homogeneous solution. This solution was filled into a space enclosed by two glass plates and a silicone rubber spacer. Under this condition, polymerization was carried out at 60° C. for 4 hours and then at 100° C. for 12 hours. The thickness of the film could be arranged by changing the thickness of the silicone rubber spacer. 125 μm (actual measurement value) thickness film was used for polymer actuators and 1.23 mm (actual measurement value) thickness film was used to determine their physical properties.

Physical properties of poly n-butyl acrylate obtained above and acryl elastomer film VHB Y-4950 available from 3M Company, are shown in Table 2.

TABLE 2

Various physical properties

| | Polymer | |
|---|---|---|
| | C-3 | C-4 |
| Physical Properties | | |
| Tα or Tg (° C.) | −37 | −24* |
| Microphase Separation | Absence | Absence |
| Dielectric constant | 4.8 | 4.7 |

*measured by Differential Scanning Calorimetry (DSC)

Synthetic Example 3

Synthesis of n-butyl Acrylate Oligomer

Into a two-liter three-necked flask, 166.7 g of n-butyl acrylate, 666.7 g of methyl ethyl ketone, 23.8 g of dodecanthiol, 10.8 mg of azoisobutyronitrile were added, and then the flask was fully flushed with nitrogen gas. Then the flask was immersed into a water bath at 60° C. and polymerization was carried out with stirring. After 5 hours from the initiation of polymerization, 5 mg of azoisobutyronitrile was added and polymerization was further continued for another 10 hours. From the obtained solution, methyl ethyl ketone, n-butyl acrylate, dodecanethiol were distilled away under reduced pressure. Further, the obtained liquid was dried under a vacuum at 150° C. for two full days and nights. The number-average molecular weight (Mn) and the molecular weight distribution (Mw/Mn) of the resulting liquid-like n-butyl acrylate oligomer were 1,625 and 1.48, respectively. This oligomer was used as a plasticizer.

Example 1

Manufacture of Polymeric Actuator

The tri-block copolymer A-1 was press molded at 200° C. to form a tri-block copolymer film having a thickness of 116 μm and then a test film whose size is 1.8 cm long by 3 cm wide was cut out from the tri-block copolymer film. As shown in FIG. 1, a rectangular plastic plate 4 with an opening the size of which was 1.7 cm long by 5.5 cm wide at a central portion of the plate 4, was provided. The cut-out tri-block copolymer test film was stretched to double its width and then placed on the plastic plate 4 having the opening and fixed using a seal 6 made of Teflon (Registered trade mark), thus obtaining a dielectric material 3.

Next, an electrode material was prepared by kneading 0.1 g of silicone grease HIVAC-G (available from Shin-Etsu Chemical Co., Ltd.; trade name) and 0.1 g of vapor-grown carbon fiber VGCF (available from Showa Denko Kabushiki Kaisha; VGCF is a registered trade mark) on an agate mortar. As shown in FIG. 1, the electrode material was applied on both central areas, the size of which was 0.5 cm long by 1.5 cm wide respectively, of both surfaces of the dielectric material 3, thus forming electrodes 2, 2. The two electrodes 2, 2 were respectively in contact with aluminum foils 5, 5 the sizes of which were each 5 cm long by 1 cm wide, and further contacted to a power source 7 (insulation resistance tester D1-10, available from Musashi Intech Corporation), thus constituting a polymeric actuator and a driving system. The driving results of the polymeric actuators using this driving system are shown in Table 3.

Example 2

Manufacture of Polymeric Actuator 2

As similar to Example 1, a dielectric material was prepared using a mixture of the block copolymer A-1 (70 parts by mass) and a block copolymer A-2 (30 parts by mass) instead of the block copolymer A-1 in Example 1. The thickness of the dielectric material before stretching was 105 μm.

Example 3

Manufacture of a Polymeric Actuator 3

The same procedure of Example 2 was carried out except that the amount of the block copolymer A-1 and the block copolymer A-2 in Example 2 were changed to 30 parts by weight and 70 parts by weight respectively. The thickness of the dielectric material before stretching was 112 μm.

Example 4

Manufacture of Polymeric Actuator 4

As similar to Example 1, a dielectric material was prepared using a block copolymer A-1 (70 parts by mass) and n-butyl acrylate oligomer (30 parts by mass), which was synthesized in Synthetic Example 3, instead of the block copolymer A-1 in Example 1. The thickness of the dielectric material before stretching was 108 μm.

Comparative Example 1

Manufacture of Polymeric Actuator 5

The same procedure of Example 1 was carried out except that C-1 was used instead of the block copolymer A-1 of Example 1 and press molding temperature was set at 175° C. The thickness of the dielectric material before stretching was 119 μm.

Comparative Example 2

Manufacture of Polymeric Actuator 6

The same procedure of Example 1 was carried out except that C-2 was used instead of the block copolymer A-1 of Example 1. The thickness of the dielectric material before stretching was 140 μm.

Comparative Example 3

Manufacture of Polymeric Actuator 7

As similar to Example 1, the (cross-linked) poly n-butyl acrylate film C-3 obtained at Synthetic Example 2 was used instead of the dielectric material comprising the block copolymer A-1 in Example 1. In this case, stretching up to double its width could not be carried out, so that the stretching ratio was changed to 1.5 times. The thickness of the dielectric material before stretching was 125 μm.

Comparative Example 4

Manufacture of Polymeric Actuator 8

In Example 1, the same procedure as in Example 1 was carried out except that C-4 was used in place of the block copolymer A-1. The thickness of the dielectric material before stretching was 1 mm which was thicker than usual, so that the dielectric material was stretched to triple its length in both longitudinal and lateral directions and then used.

TABLE 3

| | | Examples | | | | Comparative Examples | | | |
|---|---|---|---|---|---|---|---|---|---|
| | | 1 | 2 | 3 | 4 | 1 | 2 | 3 | 4 |
| Dielectric Material | | A-1 | A-1 (70 parts) A-2 (30 parts) | A-1 (30 parts) A-2 (70 parts) | A-1 (70 parts) +oligomer* | C-1 | C-2 | C-3 | C-4 |
| Durability of Dielectric Material | | ++ | + | − | + | −− | − | −− | −− |
| Operation | | | | | | | | | |
| Linear Strain (%) | | 10 | 13 | 18 | 15 | 8 | 7 | 5 | 19 |
| Areal Strain (%) | | 21 | 28 | 39 | 32 | 12 | 14 | 10 | 42 |

*n-butyl acrylate oligomer produced in Synthetic Example 3

As the results of the operational tests, when voltage was applied to the polymeric actuators of Examples 1 to 4 and Comparative Examples 1 to 4, the electrode parts of the actuator immediately expanded in the longitudinal and lateral directions, and when voltage was cut, the electrode portions immediately returned to their original shapes.

The polymeric actuators of the present invention (Examples 1 to 4) were highly deformed when compared with the corresponding Comparative Examples 1 to 3 which were outside the present invention. It turned out that operation performance of the present polymeric actuators is excellent.

The dielectric material of the present invention has excellent shape stability because of its mechanical strength under stretched conditions. However, in Comparative Examples of 1, 3 and 4, the dielectric materials have poor durability, so that problems occur when the materials are actually used as polymeric actuators. In Comparative Example 1, dielectric material is considered to be fractured because Tα of the block B-1 which was contained in the block copolymer C-1 was as low as 67° C. and accordingly it is considered that stress relaxation properties became poor. And dielectric materials in Comparative Examples 3 and 4 were cross-linked ones, so that stress might have been locally concentrated on a certain molecular chain, causing a fracture in the dielectric materials.

From the results mentioned above, the polymeric actuators of the present invention are confirmed to have an excellent operation property.

INDUSTRIAL APPLICABILITY

The polymeric actuator of the present invention has an excellent operation performance and is capable of improving shape flexibility as well, so that it can be used, for example, as an artificial muscle. Further, the polymeric actuators of the present invention are essentially piezoelectric elements, therefore they can be used as sensor elements to detect a pressure, force, displacement, etc. or a generators or the like to change mechanical energy such as displacement, force, etc. into electric energy.

What is claimed is:

1. A dielectric material for a polymeric actuator comprised of a moveable part of the polymeric actuator driven by an electric field comprising;

a block copolymer (A) having a microphase-separated structure including a polymer block (B1) and a polymer block (B2) both of which are immiscible with each other, wherein a main compositional unit in the polymer block (B1) and the polymer block (B2) is a (meth)acrylic ester unit, the polymer block (B1) has an alpha-dispersion temperature of 70° C. or more, and the polymer block (B2) has an alpha-dispersion temperature of 25° C. or less.

2. The dielectric material for the polymeric actuator according to claim 1, wherein the block copolymer (A) has a block sequence of polymer block (B1)-polymer blocks (B2)-polymer block (B1).

3. The dielectric material for the polymeric actuator according to claim 1, wherein the main compositional unit in the polymer block (B1) is a methyl methacrylate unit and the main compositional unit in the polymer block (B2) is an alkyl acrylate unit whose alkyl group has 1 to 5 carbon atoms.

4. The dielectric material for the polymeric actuator according to claim 1, wherein the dielectric material comprises the block copolymer (A) having the polymer block (B1) and the polymer block (B2) and another block copolymer (A) having a polymer block (B1) and a polymer block (B2) whose block sequence differs from the former block copolymer (A).

5. The dielectric material for the polymeric actuator according to claim 1, further comprising a plasticizer in an amount less than 100 parts by mass based on 100 parts by mass of the block copolymer (A).

6. A polymeric actuator comprising:
the dielectric material for the polymeric actuator according to claim 1 provided between electrodes.

7. The polymeric actuator according to claim 6, wherein a main electroconductive material used in the electrodes is carbon nanofiber.

8. The polymeric actuator according to claim 6, wherein the electrodes contain the block copolymer (A) and carbon nanofiber.

* * * * *